US011515429B2

United States Patent
Ochi et al.

(10) Patent No.: US 11,515,429 B2
(45) Date of Patent: Nov. 29, 2022

(54) THIN FILM TRANSISTOR INCLUDING OXIDE SEMICONDUCTOR LAYER

(71) Applicant: Kobe Steel, Ltd., Kobe (JP)

(72) Inventors: Mototaka Ochi, Hyogo (JP); Hiroshi Goto, Hyogo (JP)

(73) Assignee: Kobe Steel, Ltd., Kobe (JP)

(*) Notice: Subject to any disclaimer, the term of this patent is extended or adjusted under 35 U.S.C. 154(b) by 89 days.

(21) Appl. No.: 17/053,537

(22) PCT Filed: Apr. 23, 2019

(86) PCT No.: PCT/JP2019/017286
§ 371 (c)(1),
(2) Date: Nov. 6, 2020

(87) PCT Pub. No.: WO2019/216209
PCT Pub. Date: Nov. 14, 2019

(65) Prior Publication Data
US 2021/0296501 A1  Sep. 23, 2021

(30) Foreign Application Priority Data
May 9, 2018 (JP) .............................. JP2018-090642

(51) Int. Cl.
*H01L 29/00* (2006.01)
*H01L 29/786* (2006.01)

(52) U.S. Cl.
CPC .................. *H01L 29/7869* (2013.01)

(58) Field of Classification Search
CPC ........... H01L 29/7869; H01L 29/42384; H01L 29/786; H01L 29/78696; H01L 29/4908;
(Continued)

(56) References Cited

U.S. PATENT DOCUMENTS 8,883,556 B2 * 11/2014 Yamazaki ............. G11C 11/403
438/301
10,608,117 B2 * 3/2020 Lee .................... H01L 29/66742
(Continued)

FOREIGN PATENT DOCUMENTS

JP  2007-281409 A  10/2007
JP  2010-219538 A   9/2010
(Continued)

OTHER PUBLICATIONS

International Search Report and Written Opinion dated Jul. 30, 2019 in PCT/JP2019/017286 (with English Translation), citing documents AO-AS therein, 16 pages.
(Continued)

*Primary Examiner* — Nikolay K Yushin
(74) *Attorney, Agent, or Firm* — Oblon, McClelland, Maier & Neustadt, L.L.P.

(57) ABSTRACT

A thin film transistor includes at least a gate electrode, a gate insulating film, an oxide semiconductor layer, source/drain electrodes, and at least one layer of a passivation film on a substrate. Metal elements constituting the oxide semiconductor layer include In, Ga, Zn, and Sn. Respective ratios of the metal elements to a total (In+Ga+Zn+Sn) of the metal elements in the oxide semiconductor layer satisfy: In: 30 atom % or more and 45 atom % or less, Ga: 5 atom % or more and less than 20 atom %, Zn: 30 atom % or more and 60 atom % or less, and Sn: 4.0 atom % or more and less than 9.0 atom %.

10 Claims, 4 Drawing Sheets

(58) Field of Classification Search
CPC ... C23C 14/08; C23C 14/002; C23C 14/3114; C23C 14/086
See application file for complete search history.

(56) References Cited

U.S. PATENT DOCUMENTS

| | | |
|---|---|---|
| 2007/0194379 A1 | 8/2007 | Hosono et al. |
| 2009/0189153 A1 | 7/2009 | Iwasaki et al. |
| 2009/0278122 A1 | 11/2009 | Hosono et al. |
| 2009/0280600 A1 | 11/2009 | Hosono et al. |
| 2011/0101352 A1 | 5/2011 | Hosono et al. |
| 2011/0201162 A1 | 8/2011 | Hosono et al. |
| 2012/0012838 A1 | 1/2012 | Hosono et al. |
| 2012/0161126 A1* | 6/2012 | Yamazaki ............ H01L 27/1108 257/43 |
| 2013/0009111 A1 | 1/2013 | Morita et al. |
| 2014/0070211 A1 | 3/2014 | Iwasaki et al. |
| 2017/0141231 A1 | 5/2017 | Matsumoto et al. |
| 2018/0323313 A1 | 11/2018 | Hosono et al. |
| 2018/0374956 A1 | 12/2018 | Lee et al. |
| 2019/0051758 A1 | 2/2019 | Ochi et al. |
| 2019/0123207 A1* | 4/2019 | Goto ................ H01L 29/78606 |
| 2020/0185531 A1 | 6/2020 | Lee et al. |

FOREIGN PATENT DOCUMENTS

| | | | |
|---|---|---|---|
| JP | 2012-124446 A | | 6/2012 |
| JP | 2013-105814 A | | 5/2013 |
| JP | 2013-229495 A | | 11/2013 |
| JP | 2017-188683 | * | 4/2017 .......... H01L 29/786 |
| JP | 2017-157813 A | | 9/2017 |
| JP | 2019-9435 A | | 1/2019 |
| TW | 200731465 A | | 8/2007 |
| TW | 201735359 A | | 10/2017 |
| TW | 201906173 A | | 2/2019 |
| WO | WO 2015/198604 A1 | | 12/2015 |

OTHER PUBLICATIONS

Mototaka Ochi, et al., "Evaluation of Stress Stabilities in Amorphous In—Ga—Zn—O Thin-Film Transistors: Effect of Passivation with Si-Based Resin" Japanese Journal of Applied Physics, vol. 5, Dec. 19, 2017, pp. 02CB06-1-02CB06-7.

* cited by examiner

THIN FILM TRANSISTOR INCLUDING OXIDE SEMICONDUCTOR LAYER

TECHNICAL FIELD

The present invention relates to a thin film transistor (TFT) including an oxide semiconductor layer. More specifically, the present invention relates to a thin film transistor including an oxide semiconductor layer, which is suitably used in a display device such as a liquid crystal display or an organic EL display.

BACKGROUND ART

Amorphous oxide semiconductors have a high carrier concentration as compared with general-purpose amorphous silicon (a-Si), and are expected to be applied to a next generation display requiring large size, high resolution, and high driving. In addition, the amorphous oxide semiconductors have large optical band gap and can be deposited at a low temperature, so that the amorphous oxide semiconductors can be deposited on a resin substrate having low heat resistance, and are expected to be applied to a light and transparent display.

As the amorphous oxide semiconductors described above, for example, an In-Ga—Zn amorphous oxide semiconductor (may be simply referred to as "IGZO" below) including indium (In), gallium (Ga), zinc (Zn), and oxygen (O) as disclosed in Patent Literature 1 is known.

Here, the field effect mobility of a thin film transistor containing an oxide semiconductor layer formed of IGZO is high as compared with the general-purpose amorphous silicon, and is about 10 $cm^2/Vs$. However, in order to achieve large screen, high definition, and high driving of a display device, a material having higher field effect mobility is required.

Thin film transistors using an oxide semiconductor layer such as IGZO are required to have excellent resistance to stress (stress stability) such as light irradiation and voltage application. Namely, for the stress such as the light irradiation and the voltage application, it is required that the threshold change amount of the thin film transistor is small. For example, when a voltage is continuously applied to a gate electrode or when blue-band light to be absorbed by the semiconductor layer is continuously transmitted, charges are trapped at an interface between a gate insulating film of the thin film transistor and a semiconductor layer of the thin film transistor, and the threshold voltage can change significantly (shift) to the negative side due to the change of charges inside the semiconductor layer. As a result, it has been pointed out that switching properties of the thin film transistor are changed.

When a liquid-crystal display panel is driven, or when a negative bias is applied to a gate electrode to light up pixels, a thin film transistor is irradiated with light leaking from a liquid crystal cell, and the light applies stress to the thin film transistor, causing unevenness of images and deterioration of properties. When a thin film transistor is used actually, the switching properties are changed due to the stress caused by the light irradiation and the voltage application, which leads to a reduction in the reliability of the display device itself.

Similarly, in the organic EL display, a semiconductor layer is irradiated with light leaking from a light emitting layer, causing a problem that a value such as a threshold voltage varies.

Such a shift of the threshold voltage leads to the reduction in the reliability of the display device itself, such as a liquid crystal display and an organic EL display which include a thin film transistor. Therefore, it is strongly desired to improve the stress stability (that is, the change amount before and after the stress application is small).

CITATION LIST

Patent Literature

Patent Literature 1: JP-A-2010-219538

SUMMARY OF INVENTION

Technical Problem

The present invention has been made in view of the above circumstances, and an object of the present invention is to provide a thin film transistor including an oxide semiconductor layer thin film, which maintains high field effect mobility and has excellent stress stability, especially excellent photo-induced stress stability.

Solution to Problem

As a result of extensive investigations, the present inventors have found that the above problems can be solved by adopting a specific composition in an oxide semiconductor layer of a thin film transistor, and have completed the present invention.

Namely, the present invention relates to the following [1].

[1] A thin film transistor including at least a gate electrode, a gate insulating film, an oxide semiconductor layer, source/drain electrodes, and at least one layer of a passivation film on a substrate, wherein metal elements constituting the oxide semiconductor layer include In, Ga, Zn, and Sn, and respective ratios of the metal elements to a total (In+Ga+Zn+Sn) of the metal elements in the oxide semiconductor layer satisfy:

In: 30 atom % or more and 45 atom % or less,
Ga: 5 atom % or more and less than 20 atom %,
Zn: 30 atom % or more and 60 atom % or less, and
Sn: 4.0 atom % or more and less than 9.0 atom %.

The preferred embodiment of the present invention relates to the following [2] to [4].

[2] The thin film transistor described in [1] above, wherein in the oxide semiconductor layer, a ratio (In/Ga) of In to Ga occupied in the metal elements is 2.5 times or more.

[3] The thin film transistor described in [1] or [2] above, wherein in the oxide semiconductor layer, desorption amount of zinc within a temperature range of 300° C. to 400° C. is $5 \times 10^{-11}$ counts or less in terms of 1 $cm^2$.

[4] The thin film transistor described in any one of [1] to [3] above, wherein a peak temperature of a signal detected from the oxide semiconductor layer by a photo-induced transient spectroscopy is 85 K or lower.

Advantageous Effects of Invention

The present invention provides a thin film transistor including an oxide semiconductor layer thin film, which maintains high field effect mobility and has excellent stress stability, especially excellent photo-induced stress stability.

DESCRIPTION OF EMBODIMENTS

Figure 1:
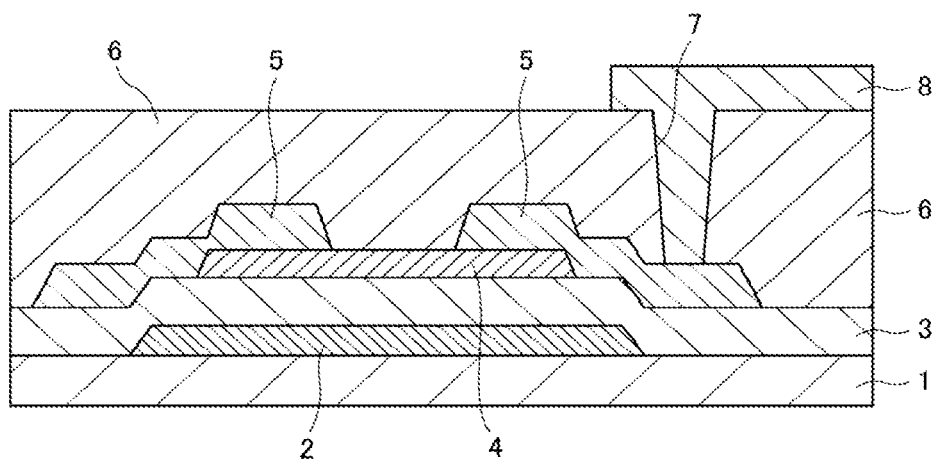
FIG. 1 is a schematic cross-sectional view illustrating a thin film transistor according to an embodiment of the present invention.

A thin film transistor according to the present invention includes at least a gate electrode, a gate insulating film, an oxide semiconductor layer, source/drain electrodes, and at least one layer of a passivation film on a substrate, in which metal elements constituting the oxide semiconductor layer include In, Ga, Zn, and Sn, and respective ratios of the metal elements to a total (In+Ga+Zn+Sn) of the metal elements in the oxide semiconductor layer satisfy:

In: 30 atom % or more and 45 atom % or less,
Ga: 5 atom % or more and less than 20 atom %,
Zn: 30 atom % or more and 60 atom % or less, and
Sn: 4.0 atom % or more and less than 9.0 atom %.

In the present description, an oxide containing In, Ga, Zn, Sn, and O may be referred to as IGZTO.

In the present description, the term "high field effect mobility" means that field effect mobility is 18.0 cm$^2$/Vs or more when the field effect mobility is measured by a method described in Examples described below. The field effect mobility may also be referred to as carrier mobility. Hereinafter, the field effect mobility may be simply referred to as "mobility".

In the present description, the term "excellent stress stability" means that the shift amount ($\Delta V_{th}$) of threshold voltage ($V_{th}$) before and after a stress application test is 3.5 V or less when the stress application test, in which a negative bias is continuously applied to a gate electrode while irradiating a sample with white light, is performed for 2 hours by a method described in Examples described below.

Hereinafter, an oxide semiconductor layer (an oxide semiconductor thin film) used in the thin film transistor of the present invention is described in detail.

In the oxide semiconductor layer of the present invention, metal elements constituting the oxide semiconductor layer include In, Ga, Zn, and Sn, and respective ratios of the metal elements to a total (In+Ga+Zn+Sn) of the metal elements in the oxide semiconductor layer satisfy:

In: 30 atom % or more and 45 atom % or less,
Ga: 5 atom % or more and less than 20 atom %,
Zn: 30 atom % or more and 60 atom % or less, and
Sn: 4.0 atom % or more and less than 9.0 atom %.

Hereinafter, the content (atom %) of In to a total (In, Ga, Zn, and Sn) of the metal elements excluding O may be referred to as an atom number ratio of In. Similarly, the content of Ga (atom %) to the total of the metal elements may be referred to as an atom number ratio of Ga. Similarly, the content of Zn (atom %) to the total of the metal elements may be referred to as an atom number ratio of Zn. Similarly, the content of Sn (atom %) to the total of the metal elements may be referred to as an atom number ratio of Sn.

In is an element contributing to an improvement of the electrical conductivity. As the atom number ratio of In increases, that is, as the amount of In occupied in the metal elements increases, the conductivity of the oxide semiconductor thin film is improved, and thus the field effect mobility is increased.

The atom number ratio of In is required to be 30 atom % or more to effectively exhibit the above effects. The atom number ratio of In is preferably 33 atom % or more, more preferably 35 atom % or more, and still more preferably 38 atom % or more.

However, when the atom number ratio of In is too large, there is a problem that the carrier density is too high to lower the threshold voltage. Therefore, the upper limit of the atom number ratio of In is set to be 45 atom % or less. The atom number ratio of In is preferably 43 atom % or less, and more preferably 41 atom % or less.

Ga is an element contributing to the reduction of oxygen deficiency and the control of a carrier density. As the atom number ratio of Ga increases, that is, as the amount of Ga occupied in the metal elements increases, effects of improving the electrical stability of the oxide semiconductor thin film and inhibiting the excessive generation of carriers are exhibited. In addition, Ga is also an element that inhibits etching based on a hydrogen peroxide based Cu etching liquid.

Therefore, as the atom number ratio of Ga increases, a selection ratio increases relative to the hydrogen peroxide based etching liquid used for an etching processing of a Cu electrode as source/drain electrodes, and the Cu electrode is less likely to be damaged. Further, when the atom number ratio of Ga is too small, the reliability of the thin film transistor against the photo-induced stress may decrease.

The atom number ratio of Ga is required to be 5 atom % or more to effectively exhibit the above effects. The atom number ratio of Ga is preferably 7 atom % or more, more preferably 9 atom % or more, and still more preferably 11 atom % or more.

However, when the atom number ratio of Ga is too large, the conductivity of the oxide semiconductor thin film is reduced and the mobility is likely to decrease. In addition, the conductivity of a sputtering target material for forming an oxide semiconductor layer is reduced, and it is difficult to stably maintain the direct-current discharge. Therefore, the atom number ratio of Ga is less than 20 atom %. The atom number ratio of Ga is preferably 18 atom % or less, more preferably 16 atom % or less, and still more preferably 14 atom % or less.

Zn is not sensitive relative to the thin film transistor properties as compared with other metal elements. However, as the atom number ratio of Zn increases, that is, as the amount of Zn occupied in the metal elements increases, the oxide semiconductor layer is made amorphous easily. Therefore, etching is easily performed with an etching liquid such as an organic acid or an inorganic acid.

The atom number ratio of Zn is required to be 30 atom % or more to effectively exhibit the above effects. The atom number ratio of Zn is preferably 33 atom % or more, more preferably 36 atom % or more, and still more preferably 39 atom % or more.

However, when the atom number ratio of Zn is too large, the solubility of an oxide semiconductor thin film in an etching liquid for source/drain electrodes is increased, and as a result, wet etching resistance is likely to deteriorate. In addition, the field effect mobility decreases since the amount of In is relatively reduced, and the electrical stability of the oxide semiconductor thin film is likely to decrease since the amount of Ga is relatively reduced. Therefore, the upper limit of the atom number ratio of Zn is set as 60 atom % or less. The above atom number ratio of Zn is preferably 55 atom % or less, more preferably 50 atom % or less, still more preferably 46 atom % or less, and even more preferably 43 atom % or less.

Sn is an element that inhibits etching based on an acid-based chemical solution. Therefore, as the atom number ratio of Sn increases, that is, as the amount of Sn occupied in the metal elements increases, the etching processing based on an etching liquid, such as an organic acid or an inorganic acid, used for the patterning of an oxide semiconductor thin film becomes difficult. However, in an oxide semiconductor to which Sn is added, an increase in the carrier density is achieved and the field effect mobility increases due to hydrogen diffusion. In addition, when the addition amount of Sn is appropriate, the reliability of the thin film transistor against the photo-induced stress is improved.

The atom number ratio of Sn is required to be 4.0 atom % or more to effectively exhibit the above effects. The atom number ratio of Sn is preferably 4.3 atom % or more, more preferably 7.0 atom % or more, and still more preferably 8.0 atom % or more.

On the other hand, when the atom number ratio of Sn is too large, the resistance of an oxide semiconductor thin film to an etching liquid such as an organic acid or an inorganic acid is increased more than necessary, and the processing of the oxide semiconductor thin film itself becomes difficult. When an oxide semiconductor is strongly affected by the hydrogen diffusion, the reliability against the photo-induced stress may decrease. Therefore, the atom number ratio of Sn is set to be less than 9.0 atom %. The atom number ratio of Sn is preferably 8.6 atom % or less, more preferably 8.4 atom % or less, and still more preferably 8.2 atom % or less.

In the oxide semiconductor layer, a ratio of In to Ga (In/Ga) occupied in the metal elements is preferably 2.5 times or more. The ratio (In/Ga) being 2.5 times or more indicates that the amount of In is required to be equal to or more than a predetermined amount relative to the amount of Ga in order to obtain high mobility for a thin film transistor. In order to obtain higher mobility, the ratio (In/Ga) is more preferably 2.8 times or more, and still more preferably 3.1 times or more.

The thickness of the oxide semiconductor layer is not particularly limited, and is preferably 10 nm or more because selectivity during the etching processing of the source/drain electrodes is excellent, more preferably 15 nm or more. In addition, the thickness is preferably, for example, 20 nm or less from the viewpoint of maintaining high mobility.

In order to achieve a thin film transistor having high mobility, a film structure of an oxide semiconductor layer is also an important factor. It is preferable that the oxide semiconductor layer is an amorphous structure or at least a part of the oxide semiconductor layer is a crystallized amorphous structure. That is, it is preferable that an oxide forming the oxide semiconductor layer has an amorphous structure, or at least a part of the oxide has a crystallized amorphous structure.

The oxide semiconductor layer is deposited by a sputtering method with high throughput, so that it is generally considered that the film structure is amorphous. However, in fact, submicron level (nano level) crystals are dispersed in an amorphous structure in the film structure. The above structure of the oxide can be obtained by controlling the gas pressure to a range of 1 to 5 mTorr when forming an oxide semiconductor layer and performing a heat treatment at a temperature at 200° C. or higher after a passivation film is formed.

A preparing process of a thin film transistor using an oxide semiconductor includes several heating treatment processes (during deposition, heat treatment, and the like), so that the amorphization degree depends on the overall results of these heat treatment processes. The film structure of the oxide semiconductor layer affects the carrier mobility, so that it is required to search for optimal process conditions in order to achieve a thin film transistor with high mobility.

Sheet resistance of the oxide semiconductor layer before the formation of the passivation film, that is, after forming the oxide semiconductor layer by sputtering and subjecting the oxide semiconductor layer to the heat treatment is preferably $1.0 \times 10^5 \Omega/\square$ or less, and more preferably $5.0 \times 10^4 \Omega/\square$ or less. The oxide semiconductor thin film having such a sheet resistance is preferable for increasing the mobility of a thin film transistor.

The sheet resistance of a general IGZO oxide semiconductor layer is often more than $1.0 \times 10^5 \Omega/\square$. In a production step of the thin film transistor, the sheet resistance of an oxide semiconductor film after the formation of the passivation film tends to increase, which is particularly remarkable in the case of a thin film transistor including an oxide semiconductor layer having such a sheet resistance. This is because the oxide semiconductor generally has a band gap, and band bending occurs by forming a passivation film.

When the amount of OH groups in the oxide semiconductor layer is increased, the photo-induced stress stability can be improved while maintaining high mobility. Namely, in a case where such an oxide semiconductor layer in which the amount of OH groups is increased is used for a display panel, the properties of the thin film transistor hardly change even though the thin film transistor receives light irradiation such as backlight over a long period of time.

This is because when hydrogen penetrates into the oxide semiconductor layer to form an OH group, oxygen-related defects and unstable hydrogen-related defects in the channel layer are effectively inhibited, and stable metal-oxygen bonds are formed. The density of the OH groups in the oxide semiconductor layer can be effectively controlled by the post-annealing.

The thin film transistor in the present invention may be either form of an etch stop (ESL) type thin film transistor including an etch stopper layer directly above the oxide semiconductor layer, and a back channel etch (BCE) type thin film transistor that does not have an etch stopper layer directly above the oxide semiconductor layer. The damage of back channel of the oxide semiconductor layer is small in the etch stop type thin film transistor having an etch stopper layer. Therefore, the etch stop type thin film transistor is more preferred from the standpoint of controllability of sheet resistance of the semiconductor film.

The passivation film in the present invention is constituted of at least one layer and preferably two or more layers. When the passivation film is constituted of two or more layers, controllability of sheet resistance of the oxide semiconductor layer is improved, and this is preferred. The reason for this is that in the case where the passivation film is a single layer composed of only a silicon nitride film ($SiN_x$), the $SiN_x$ film has very large hydrogen content, and hydrogens easily diffuse in the semiconductor layer, act as a donor and as a result, the hydrogens fluctuate in a direction greatly decreasing sheet resistance.

Examples of the passivation film include a silicon oxide film ($SiO_x$ film), a $SiN_x$ film, an oxide such as $Al_2O_3$ or $Y_2O_3$, and laminate films of those. When the passivation film is constituted of two or more layers, the component of the first layer preferably differs from the component of the second and subsequent layers. These films can be formed by the common method such as a chemical vapor deposition (CVD) method. Of those, the passivation film containing the $SiN_x$ film is preferred from the standpoint easy control of sheet resistance of the oxide semiconductor layer within a certain range.

The passivation film has a thickness of preferably 100 to 500 μm, and more preferably 250 to 300 In the case where the passivation film is a laminate film having two or more layers, the total thickness is preferably within the above range. When the passivation film is formed by the CVD method, the film thickness can be changed by adjusting deposition time. The thickness of the passivation film can be measured by optical measurement, step measurement, or measurement by observation with a scanning electron microscope (SEM).

As the substrate, the gate electrode, the gate insulating film, and the source/drain electrodes in the present invention, the materials generally used can be used. Examples of the substrate include a transparent substrate, a Si substrate, a thin metal sheet such as stainless steel, and a resin substrate such as a polyethylene terephthalate (PET) film. The thickness of the substrate is preferably 0.3 mm to 1.0 mm from the standpoint of workability. As the gate electrode and source/drain electrodes, an Al alloy, an Al alloy having a thin film or an alloy film of Mo, Cu, Ti, or the like formed thereon, and the like can be used.

The thickness is not particularly limited either, and the thickness of the gate electrode is preferably 100 to 500 μm from the standpoint of electric resistance, and the thickness of the source/drain electrodes is preferably 100 to 400 μm from the standpoint of electric resistance. As the manufacturing method of these electrodes, the common methods can be used.

The gate insulating film may be a single layer and may be two or more layers, and the gate insulating film commonly used can be used. Examples of the gate insulating film include a $SiO_x$ film, a $SiN_x$ film, an oxide such as $Al_2O_3$ or $Y_2O_3$, and laminate films of those. When the gate insulting film is two or more layers, the film having different components between the first layer and the second and subsequent layers is preferred.

The gate insulating film can be formed by the method generally used, and the example thereof includes the CVD method. The thickness of the gate insulating film is preferably 50 to 300 μm from the standpoint of electrostatic capacity of a thin film transistor. In the case where the gate insulating film is a laminate film having two or more layers, the total thickness is preferably within the above range.

<Manufacturing Method of Thin Film Transistor (BCE Type)>

The thin film transistor according to the present invention is not limited to an etch stop (ESL) type and a back channel etch (BCE) type and can be manufactured by the same method under the same conditions as in common methods and conditions. The thin film transistor according to the present invention is not limited to, for example, TFT having a bottom gate type structure shown in FIG. 1, and may be top gate type TFT. One example of the manufacturing method of TFT is described below, but the present invention is not limited to this example.

A gate electrode is formed on a substrate by a sputtering method or the like. After conducting the patterning, a gate insulating film is deposited by a CVD method or the like. The patterning can be conducted by the ordinary method. Heating is conducted in the deposition of the gate insulting film. Next, an oxide semiconductor layer is deposited by a sputtering method or the like and patterning is then conducted. Thereafter, a pre-annealing treatment is conducted and deposition of an etch stopper layer and patterning are conducted as necessary.

Subsequently, source/drain electrodes are formed by a sputtering method or the like, patterning is conducted, and a passivation film is then deposited. Heating is conducted in the deposition of the passivation film. In the case of a back channel etch type thin film transistor, after conducting recovery annealing, the deposition of a passivation film is conducted again. Thereafter, etching of a contact hole is conducted and a post-annealing treatment (heat treatment) is then conducted. Thus, a thin film transistor can be obtained.

EXAMPLE

Example 1

[Manufacturing of Thin Film Transistor]

The manufacturing method of a thin film transistor is described below with reference to FIG. 1. A Mo film was deposited in a thickness of 250 nm as a gate electrode 2 on a glass substrate 1 (trade name: EAGLE 2000 manufactured by Eagle, diameter: 4 inches, thickness: 0.7 mm) and a silicon oxide ($SiO_x$) film having a thickness of 250 nm was deposited as a gate insulating film 3 on the Mo film by a plasma CVD method under the following conditions.

Carrier gas: Mixed gas of $SiH_4$ and $N_2O$
Deposition power density: 0.96 W/cm$^2$
Deposition temperature: 320° C.
Gas pressure during deposition: 133 Pa Next, an oxide semiconductor layer 4 as an In-Ga—Zn-Sn-O film shown in Table 1 was deposited in a film thickness of 40 nm under the following conditions.

(Formation of Oxide Semiconductor Layer)
Deposition method: DC sputtering method
Apparatus: CS200 manufactured by ULVAC, Inc.
Deposition temperature: Room temperature
Gas pressure: 1 mTorr
Carrier gas: Ar
Oxygen partial pressure: 100×$O_2$/(Ar+$O_2$)=4 vol %
Deposition power density: 2.55 W/cm$^2$ Analysis of the content of each metal element of the oxide semiconductor layer 4 was conducted by separately preparing a sample obtained by forming each oxide semiconductor layer having a film thickness of 40 nm on a glass substrate by a sputtering method in the same manner as above. The analysis was conducted by inductively coupled plasma (ICP) emission spectroscopy using CIROS Mark II manufactured by Rigaku Corporation.

After depositing the oxide semiconductor layer 4 as above, patterning was conducted by photolithography and wet etching. "TTO-07N" manufactured by Kanto Chemical Co., Inc. was used as a wet etchant. It was confirmed in the present example that residues by wet etching were not observed in all oxide semiconductor layers tested, and etching could be appropriately performed. After patterning the oxide semiconductor layer, pre-annealing was conducted in order to improve the film quality. The pre-annealing was conducted at 350° C. for 1 hour in an air atmosphere.

Next, in order to form source/drain electrodes 5, a pure Mo film having a film thickness of 100 nm was formed by a photolithography process and patterning. Thus, the source/drain electrodes 5 were formed.

(Formation of Source/Drain Electrodes)

Deposition conditions of the pure Mo film are shown below.

Power charged: DC 300W (deposition power density: 3.8 W/cm$^2$)

Carrier gas: Ar

Gas pressure: 2 mTorr

Substrate temperature: Room temperature

A laminate film having a total film thickness of 350 nm obtained by laminating a SiO$_x$ film having a film thickness of 200 nm and a SiN$_x$ film having a film thickness of 150 nm was further formed as a passivation film 6 by a plasma CVD method. A mixed gas of SiH$_4$, N$_2$ and N$_2$O was used in the formation of the SiO$_x$ film and a mixed gas of SiH$_4$, N$_2$ and NH$_3$ was used in the formation of the SiN$_x$ film. Deposition conditions in both cases are as follows.

(Formation of Passivation Film)

Deposition power density: 0.32 W/cm$^2$

Deposition temperature: 150° C.

Gas pressure during deposition: 133 Pa

Next, a contact hole 7 for probing for evaluation of transistor properties was formed in the passivation film 6 by photolithography and dry etching, and a transparent conductive film 8 was electrically connected to the source/drain electrodes 5 through the contact hole 7.

Thereafter, heat treatment was conducted at 250° C. for 30 minutes in the nitrogen atmosphere as the post-annealing. Thus, the thin film transistors of Nos. 1 to 5 were obtained.

[Evaluation of Static Properties (Field Effect Mobility μ$_{sat}$, V$_{th}$)]

Drain current (I$_d$)-gate voltage (V$_g$) properties were measured using a thin film transistor having the oxide semiconductor layer having the composition shown in Table 1. The I$_d$-V$_g$ properties were measured by setting a gate voltage and a voltage of source/drain electrodes and using a prober and a semiconductor parameter analyzer (Keithley 4200SCS).

Gate voltage: −30 to 30 V (step 0.25 V)

Source voltage: 0 V

Drain voltage: 10 V

Measurement temperature: Room temperature

The field effect mobility μsat and the threshold voltage (V$_{th}$) were calculated from the I$_d$-V$_g$ properties measured. The V$_{th}$ was a value of Vg when drain current flowed in an amount of 10$^{-9}$ A.

[Evaluation of Stress Stability]

Next, using a thin film transistor having oxide semiconductor layers having the respective compositions, stress stability (ΔV$_{th}$ @NBTIS) was evaluated as follows. The stress stability was evaluated by conducting a stress application test in which light was transmitted while applying a negative bias to a gate electrode.

Stress application conditions are as follows.

Gate voltage: −20 V

Source/drain voltage: 10 V

Substrate temperature: 60° C.

Photo-induced stress conditions

Stress application time: 2 hours

Light intensity: 25000 NIT

Light source: White LED

The ΔV$_{th}$ used herein indicates the shift amount of the threshold voltage, and is (V$_{th}$ at 2 hours later of stress application)−(V$_{th}$ at a time point immediately after stress application).

These results are shown in Table 1.

TABLE 1

| | Composition of oxide semiconductor layer | | | | | Process | Properties of thin film transistor | | Stress stability |
|---|---|---|---|---|---|---|---|---|---|
| | | | | | | Post-annealing | I$_d$-V$_g$ properties | | ΔV$_{th}$ |
| No. | In (at %) | Ga (at %) | Zn (at %) | Sn (at %) | In/Ga | Temperature (° C.) | μ$_{sat}$ (cm$^2$/Vs) | V$_{th}$ (V) | @NBTIS (V) |
| 1 | 42.3 | 13.2 | 44.5 | 0.0 | 3.2 | 250 | 19.1 | 2.5 | 4.0 |
| 2 | 40.1 | 12.5 | 43.1 | 4.3 | 3.2 | | 18.7 | 1.8 | 3.3 |
| 3 | 38.4 | 12.0 | 41.0 | 8.6 | 3.2 | | 22.7 | 1.5 | 2.5 |
| 4 | 32.7 | 10.5 | 38.2 | 18.6 | 3.1 | | 23.9 | −0.5 | 5.5 |
| 5 | 27.9 | 8.8 | 33.3 | 30.0 | 3.2 | | 24.3 | −0.5 | 8.8 |

In Table 1, Nos. 2 and 3 are Examples, and Nos. 1, 4, and 5 are Comparative Examples. Nos. 1 to 5 are obtained by fixing the composition ratio (atom %) among In, Ga, and Zn, and changing the content of Sn.

From the results of Table 1, in each Example, the composition of the metal elements in an oxide semiconductor layer used for a thin film transistor is within a range specified in the present invention, and as a result, the field effect mobility satisfies a range of 18.0 cm$^2$/Vs or more, and the shift amount (ΔV$_{th}$) of the threshold voltages (V$_{th}$) before and after the stress application test satisfies a range of 3.5 V or less. Therefore, it is possible to achieve both high field effect mobility and excellent stress stability.

The improvement of ΔV$_{th}$ in Nos. 2 and 3 in which an appropriate amount of Sn was added was achieved compared with No. 1 as a case where the content of Sn is 0 (0.0 at %). However, ΔV$_{th}$ increased on the contrary in Nos. 4 and 5 in which the content of Sn was much more than 8.6 atom %. Therefore, in order to achieve both the high field effect mobility and the excellent stress stability, it is effective to control the content of Sn to be 4.0 atom % or more and less than 9.0 atom %, preferably 4.3 atom % or more and 8.6 atom % or less.

Figure 2:
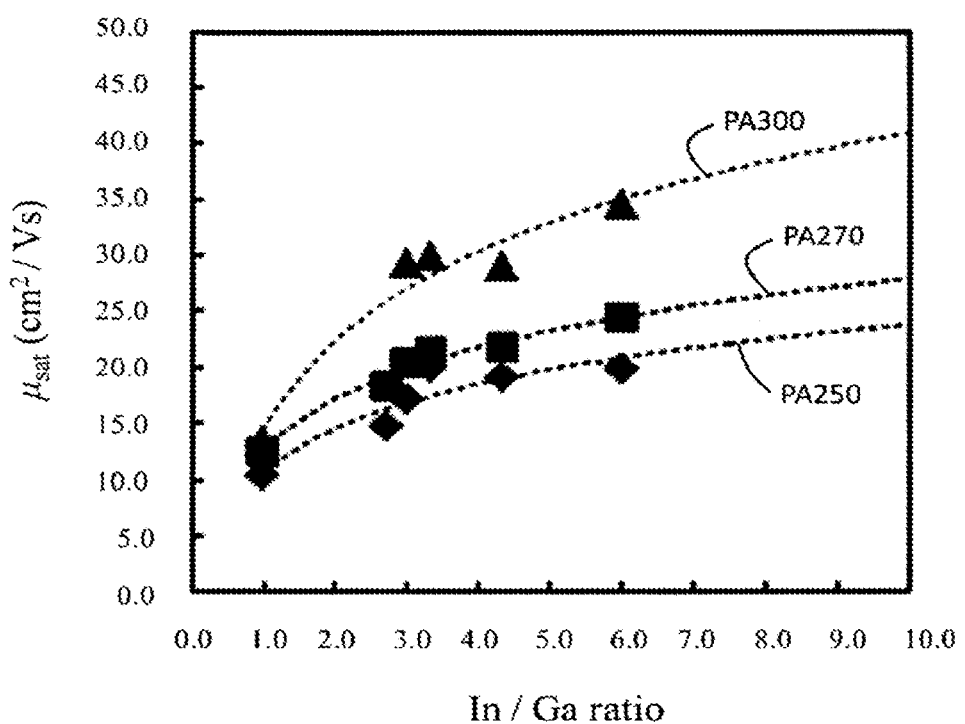
FIG. 2 is a graph showing a relationship between a ratio of "In/Ga" in an IGZTO oxide semiconductor and the "field effect mobility $\mu_{sat}$".

In all Nos. 1 to 5, a ratio of In to Ga (In/Ga) occupied in the metal elements satisfies a range of 2.5 times or more, and the high field effect mobility can be achieved. Here, as shown in FIG. 2, the field effect mobility rapidly increases near a point where an In/Ga ratio is 2.5 in a case where the In/Ga ratio in the IGZTO oxide semiconductor is changed in ESL-TFT (thin film transistor). In FIG. 2, "PA250" represents a case where post-annealing is carried out at a temperature of 250° C., "PA270" represents a case where post-annealing is carried out at a temperature of 270° C., and "PA300" represents a case where post-annealing is carried out at a temperature of 300° C. In a case where the post-annealing is performed at a temperature of 300° C., very high field effect mobility of 30.0 cm$^2$/Vs or more can be achieved under a condition that an In/Ga ratio is 3.0 or more.

[Evaluation by TDS Analysis]

The above oxide semiconductors of Nos. 1 to 5 were evaluated by thermal desorption spectroscopy (TDS). In the TDS analysis, the desorption amount in the case of the mass-to-charge ratio M/z=64 corresponding to Zn was measured. A sample, which was obtained by forming each oxide semiconductor layer having a film thickness of 40 nm on a glass substrate by a sputtering method in the same manner as above, was separately prepared as a sample for TDS analysis.

Figure 3:
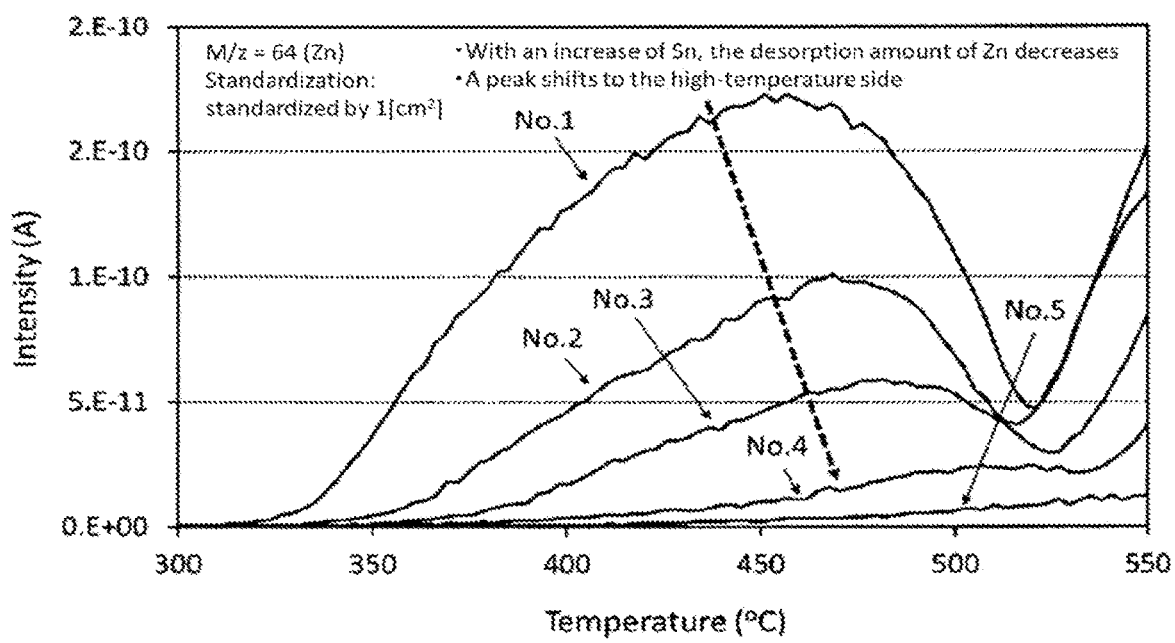
FIG. 3 is a graph showing the results of TDS analysis for oxide semiconductors of No. 1 to No. 5.

FIG. 3 shows the results of TDS analysis of the oxide semiconductors of Nos. 1 to 5. In FIG. 3, the horizontal axis indicates a heating temperature (° C.) of the substrate, and the vertical axis indicates an intensity (A) proportional to the desorption amount in the case of the mass-to-charge ratio M/z=64. As shown in the results of FIG. 3, it can be found that, with an increase in the content of Sn, the desorption amount of Zn decreases, and a peak shifts to the high-temperature side. From this fact, it is considered that the improvement of $\Delta V_{th}$ due to the increase in the addition amount of Sn is affected by the decrease in the desorption amount of Zn from the oxide semiconductor film. However, as described above, $\Delta V_{th}$ increases on the contrary in a case where the content of Sn is excessive, which is affected by the fact that excessive hydrogen is occluded in the semiconductor film.

As shown in FIG. 3, in Nos. 2 and 3 that are Examples, it is understood that since values (intensity) on the vertical axis of points whose values on the horizontal axis are within a temperature range of 300° C. to 400° C. satisfy a range of 5.E-11t (A) or less, the desorption amount of zinc within the temperature range of 300° C. to 400° C. is $5 \times 10^{-11}$ counts or less in terms of 1 cm$^2$.

Example 2

[Influence on $\Delta V_{th}$ Due to Difference in Post-Annealing Temperature]

Regarding ESL-TFT (thin film transistor) having the oxide semiconductor layer of No. 3, results of the evaluation of stress stability ($\Delta V_{th}$ @NBTIS) in a case where post-annealing was carried out at a temperature of 250° C. and in a case where post-annealing was carried out at a temperature of 300° C. were compared. Conditions of the stress application test are the same as described above.

Figure 4:
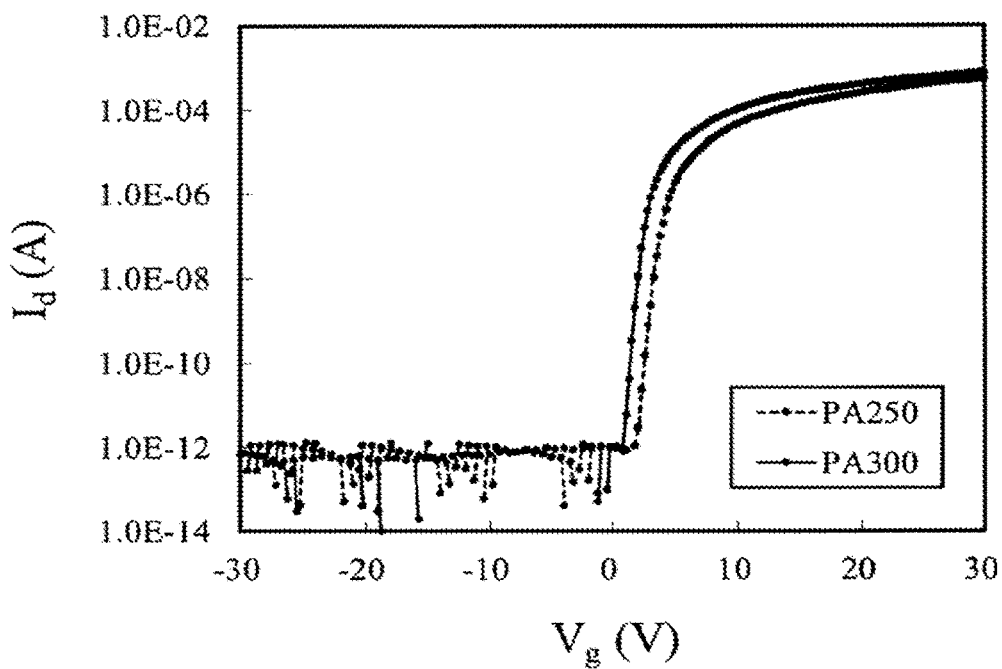
FIG. 4 is a graph showing $I_d$-$V_g$ properties of a thin film transistor using an oxide semiconductor layer of No. 3 in a case where post-annealing is carried out at 250° C. and a case where post-annealing is carried out at 300° C.

FIG. 4 is a graph showing $I_d$-$V_g$ properties of ESL-TFT (thin film transistor) using the oxide semiconductor layer of No. 3 in a case where post-annealing is carried out at a temperature of 250° C. and a case where post-annealing is carried out at a temperature of 300° C. In FIG. 4, "PA250" represents a case where post-annealing is carried out at a temperature of 250° C., and "PA300" represents a case where post-annealing is carried out at a temperature of 300° C. From these $I_d$-$V_g$ properties, the field effect mobility ($\mu_{sat}$), the shift amount ($V_{th}$) of the threshold voltage, the sub-threshold coefficient (SS), and the on-current ($I_{on}$) were calculated.

(Case of Post-Annealing at 250° C.)

Field effect mobility ($\mu_{sat}$): 19.94 cm$^2$/Vs
Shift amount ($\Delta V_{th}$) of threshold voltage: 3.00 V
Sub-threshold coefficient (SS): 0.35 V/dec
On-current ($I_{on}$): $5.6 \times 10^{-4}$ (A)
Field effect mobility ($\mu_{sat}$): 29.86 cm$^2$/Vs
Shift amount ($\Delta V_{th}$) of threshold voltage: 1.75 V
Sub-threshold coefficient (SS): 0.29 V/dec
On-current ($I_{on}$): $7.7 \times 10^{-4}$ (A)

It was confirmed from the above results that $\Delta V_{th}$ was reduced from 3.00 V to 1.75 V by about 58% in the case where post-annealing was carried out at a temperature of 300° C. as compared with the case where post-annealing was carried out at a temperature of 250° C. It was understood from this fact that $\Delta V_{th}$ could be greatly improved by an increase in the post annealing temperature.

[Evaluation of Electronic State by Photo-Induced Transient Spectroscopy (PITS)]

Regarding ESL-TFT (thin film transistor) using the oxide semiconductor layer of No. 3, evaluations of electronic states, by the photo-induced transient spectroscopy (PITS), in a case where post-annealing was carried out at a temperature of 250° C., in a case where post-annealing was carried out at a temperature of 270° C., and in a case where post-annealing was carried out at a temperature of 300° C. were performed. Details of the PITS method are described in JP-A-2015-179828. A specific measurement procedure is as follows.

First, a voltage was applied to the source electrode and the drain electrode. The applied voltage was 10 V.

After the voltage between the source electrode and the drain electrode was in an equilibrium state, a voltage was applied to the gate electrode. The applied voltage was adjusted to be $10^{-9}$ A for each thin film transistor.

After the voltage of the gate electrode was in an equilibrium state, the oxide semiconductor thin film was irradiated with pulsed light. The irradiation conditions of the pulsed light are as follows.

Laser wavelength: 375 nm
Laser pulse width: 100 ms
Range of measurement temperature: 80 K to 400 K (measurement interval: 2 K)
Measurement time window tw: 20 ms, 100 ms, 1000 ms
Apparatus: FT-1030 HERA DLTS (manufactured by Phys Tech)

Next, regarding each measurement temperature, a temporal change ΔI of the current I between the source electrode and the drain electrode after the irradiation with the pulsed light was calculated. In the present example, b1 obtained by subjecting ΔI to Fourier transform and extracting only specific components was measured instead of ΔI in the same manner as in the example described in JP-A-2015-179828. b1 was obtained by setting the number of current measurement points between tws to be 128 points and subjecting the obtained current value to Fourier transform to extract a first-order component.

Figure 5A:
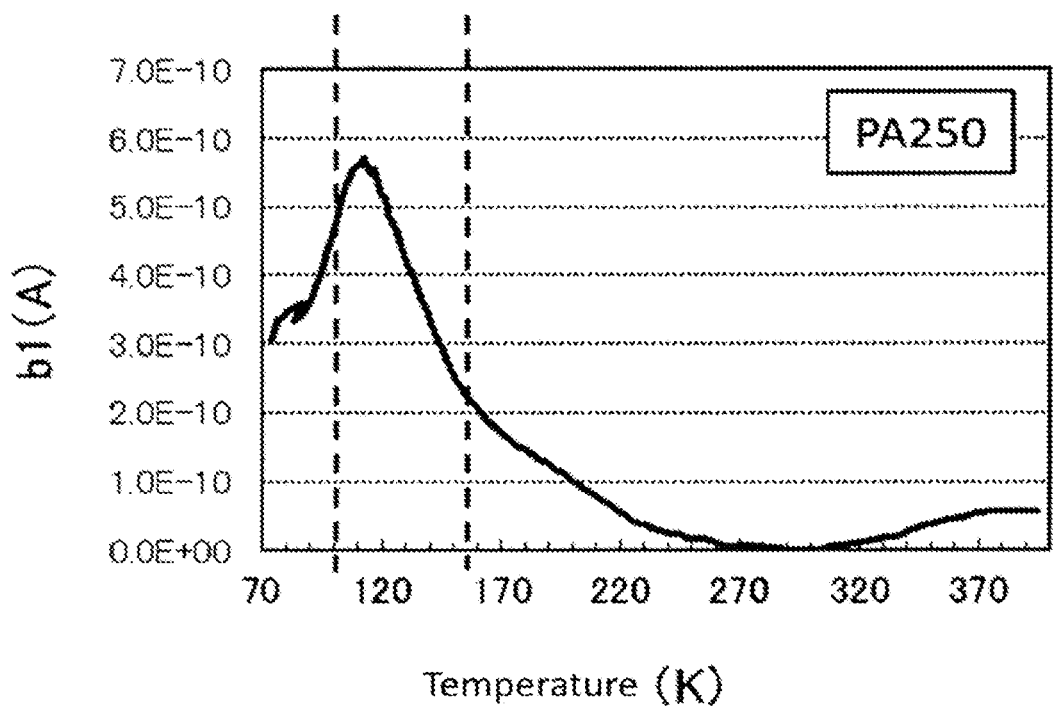
FIG. 5A is a graph showing a relationship between a measurement temperature and b1 in a case where a PITS method is applied to TFT using the oxide semiconductor of No. 3 (post-annealing temperature: 250° C.).
Figure 5B:
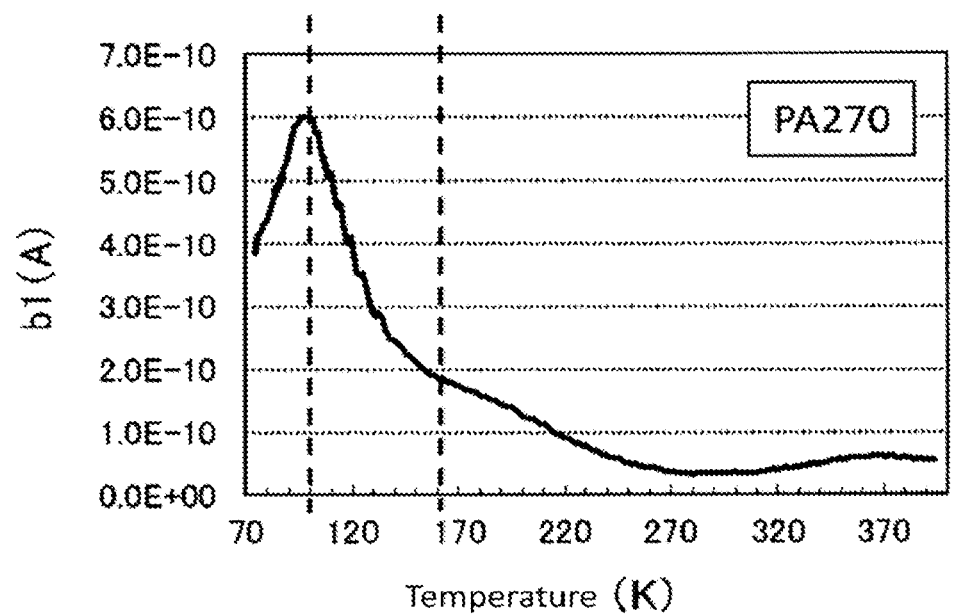
FIG. 5B is a graph showing a relationship between a measurement temperature and b1 in a case where a PITS method is applied to TFT using the oxide semiconductor of No. 3 (post-annealing temperature: 270° C.).
Figure 5C:
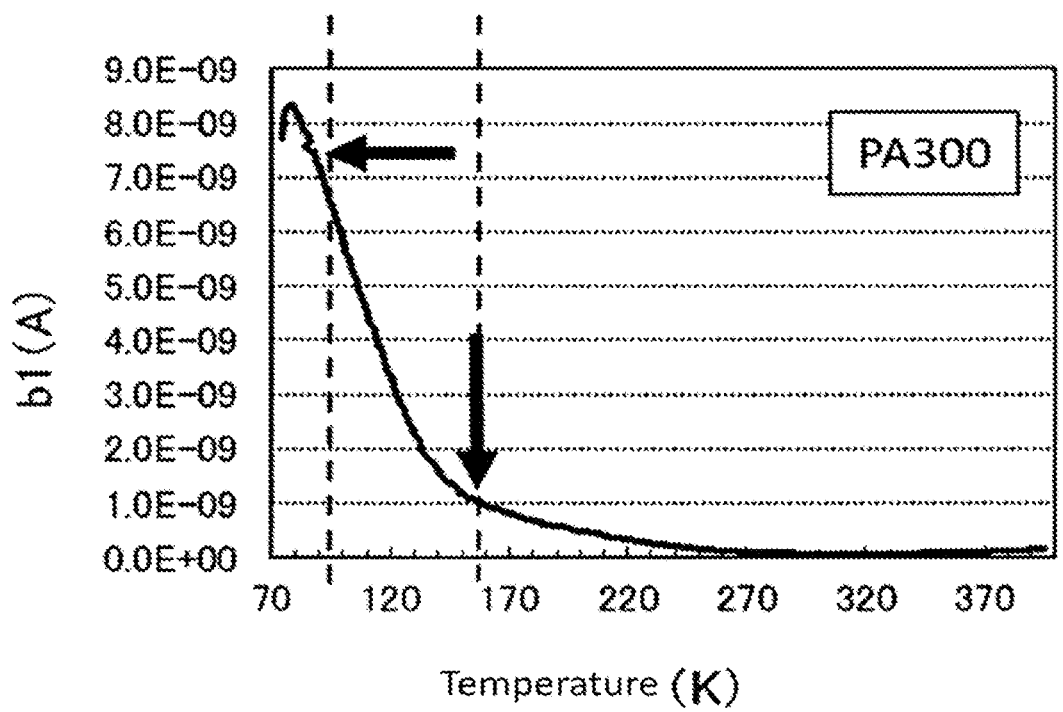
FIG. 5C is a graph showing a relationship between a measurement temperature and b1 in a case where a PITS method is applied to TFT using the oxide semiconductor of No. 3 (post-annealing temperature: 300° C.).

FIG. 5A shows a relationship between b1 and a measurement temperature in a case where post-annealing was carried out at 250° C., FIG. 5B shows a relationship between b1 and a measurement temperature in a case where post-annealing was carried out at 270° C., and FIG. 5C shows a relationship between b1 and a measurement temperature in a case where post-annealing was carried out at 300° C.

It was understood from the results of FIG. 5A to FIG. 5C that with the increase in the post-annealing temperature, a peak near 150 K of a measurement temperature was lowered and a peak near 100 K tended to shift to a low-temperature side. As shown in the result of FIG. 5C, in the case where post-annealing was carried out at a temperature of 300° C., the peak temperature of the above b1, which was a signal detected from an oxide semiconductor layer, was 85 K or lower.

It is known that the former is caused by hydrogen-related defects and that the latter is caused by zinc-related defects (for details, refer to Japanese Journal of Applied Physics 56, 03BB02 (2017)). As described above, it is assumed that the defect density of these defects in the oxide semiconductor thin film is reduced by the increase in the post-annealing temperature, and $\Delta V_{th}$ is improved.

Although the embodiments are described above with reference to the drawings, it is needless to say that the present invention is not limited to such examples. It will be apparent to those skilled in the art that various changes and modifications may be conceived within the scope of the claims. It is also understood that the various changes and modifications belong to the technical scope of the present invention. Constituent elements in the embodiments described above may be combined freely within a range not departing from the spirit of the present invention.

The present application is based on a Japanese patent application (Japanese Patent Application No. 2018-090642) filed on May 9, 2018, the contents of which are incorporated by reference in the present application.

REFERENCE SIGNS LIST

1 Substrate
2 Gate electrode
3 Gate insulating film
4 Oxide semiconductor layer
5 Source/drain electrodes
6 Passivation film
7 Contact hole
8 Transparent conductive film

The invention claimed is:

1. A thin film transistor, comprising:
a gate electrode,
a gate insulating film,
an oxide semiconductor layer,
source/drain electrodes,
a substrate, and
a layer of a passivation film on the substrate,
wherein metal elements constituting the oxide semiconductor layer comprises In, Ga, Zn, and Sn, and respective ratios of the metal elements to a total (in +Ga+Zn+Sn) of the metal elements in the oxide semiconductor layer satisfy:
In: 30 atom % or more and 45 atom % or less,
Ga: 5 atom % or more and less than 20 atom %,
Zn: 30 atom % or more and 60 atom % or less, and
Sn: 4.0 atom % or more and less than 9.0 atom %
wherein in the oxide semiconductor layer, a ratio (In/Ga) of In to Ga occupied in the metal elements is 2.5 times or more,
wherein in the oxide semiconductor layer, desorption amount of zinc within a temperature range of 300° C. to 400° C. is $5 \times 10^{-11}$ counts or less in terms of 1 cm$^2$.

2. The thin film transistor according to claim 1, wherein a peak temperature of a signal detected from the oxide semiconductor layer by a photo-induced transient spectroscopy is 85 K or lower.

3. The thin film transistor according to claim 1, wherein the layer of the passivation film comprises:
a first layer in contact with the oxide semiconductor layer; and
a second layer, wherein the first layer and the second layer comprises different materials.

4. The thin film transistor according to claim 3, wherein the second layer comprises silicon nitride.

5. The thin film transistor according to claim 1, wherein:
the layer of the passivation film and the gate electrode are positioned on opposing sides of the oxide semiconductor layer, and
the layer of the passivation film comprises silicon nitride.

6. The thin film transistor according to claim 1, wherein the oxide semiconductor layer has a thickness of 10 nm or more and less than 20 nm.

7. The thin film transistor according to claim 1, wherein the layer of the passivation film has a thickness of 100 to 500 µm.

8. The thin film transistor according to claim 1, wherein the gate electrode has a thickness of 100 to 500 µm.

9. The thin film transistor according to claim 1, wherein the gate insulating film has a thickness of 50 to 300 µm.

10. The thin film transistor according to claim 1, wherein in the oxide semiconductor layer, the ratio (In/Ga) of in to Ga occupied in the metal elements is 6 times or more.

* * * * *